(12) United States Patent
Woehlert et al.

(10) Patent No.: US 9,812,376 B2
(45) Date of Patent: Nov. 7, 2017

(54) ELECTRICALLY CONDUCTIVE ELEMENT, POWER SEMICONDUCTOR DEVICE HAVING AN ELECTRICALLY CONDUCTIVE ELEMENT AND METHOD OF MANUFACTURING A POWER SEMICONDUCTOR DEVICE

(71) Applicant: Infineon Technologies AG, Neubiberg (DE)

(72) Inventors: Stefan Woehlert, Villach (AT);
Michael Nelhiebel, Villach (AT);
Siegfried Roehl, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/753,797

(22) Filed: Jun. 29, 2015

(65) Prior Publication Data
US 2016/0013117 A1    Jan. 14, 2016

(30) Foreign Application Priority Data
Jul. 8, 2014   (DE) .................. 10 2014 109 489

(51) Int. Cl.
| | | |
|---|---|---|
| *H01L 23/34* | (2006.01) | |
| *H01L 23/427* | (2006.01) | |
| *H01L 21/48* | (2006.01) | |
| *H01L 21/768* | (2006.01) | |
| *H01L 23/532* | (2006.01) | |

(52) U.S. Cl.
CPC ........ *H01L 23/427* (2013.01); *H01L 21/4871* (2013.01); *H01L 21/76838* (2013.01); *H01L 23/4275* (2013.01); *H01L 23/53209* (2013.01); *H01L 23/53214* (2013.01); *H01L 23/53228* (2013.01); *H01L 2924/0002* (2013.01)

(58) Field of Classification Search
CPC ..... H01L 23/40; H01L 23/34; H01L 23/3736; H01L 23/427; H01L 23/53209
See application file for complete search history.

(56) References Cited

U.S. PATENT DOCUMENTS

| | | |
|---|---|---|
| 2011/0310562 A1 | 12/2011 | Strader et al. |
| 2012/0273920 A1 | 11/2012 | Fedorov et al. |
| 2014/0209852 A1* | 7/2014 | Schulze ............. H01L 27/2436 257/5 |

FOREIGN PATENT DOCUMENTS

| | | |
|---|---|---|
| CN | 1568542 A | 1/2005 |
| CN | 102907191 A | 1/2013 |

* cited by examiner

*Primary Examiner* — (Vikki) Hoa B Trinh
(74) *Attorney, Agent, or Firm* — Murphy, Bilak & Homiller, PLLC (57) ABSTRACT

An electrically conductive element includes an electrically conductive material and a plurality of inclusions of a phase change material. The phase change material has a phase transition temperature Tc between 150° C. and 400° C. The inclusions are separated from each other and are embedded in the electrically conductive material.

14 Claims, 7 Drawing Sheets

ELECTRICALLY CONDUCTIVE ELEMENT, POWER SEMICONDUCTOR DEVICE HAVING AN ELECTRICALLY CONDUCTIVE ELEMENT AND METHOD OF MANUFACTURING A POWER SEMICONDUCTOR DEVICE

PRIORITY CLAIM

This application claims priority to German Patent Application No. 10 2014 109 489.1 filed on 8 Jul. 2014, the content of said application incorporated herein by reference in its entirety.

BACKGROUND

In power semiconductor devices such as insulated gate bipolar transistors (IGBTs), diodes, field effect transistors, for example, metal oxide semiconductor field effect transistors (MOSFETs), thermal energy may be released. For example, thermal energy pulses may be released during switching off a power device. In some cases, these high thermal exposures may be accompanied by current filaments that may cause hotspots and may even lead to destruction of the semiconductor power device.

Accordingly, thermal management of power devices becomes a limiting factor for the progress in miniaturization and the advance in power density. With reduced sizes of the semiconductor devices, the area that may dissipate heat is reduced. As a consequence, concepts for handling the increasing power density and especially the increasing heat generated during switching off with shrinking device dimensions are desired.

SUMMARY

According to an embodiment, a power semiconductor device comprises a semiconductor body, active portions of the power semiconductor device being formed in the semiconductor body, and an electrically conductive element electrically coupled to at least one active portion in the semiconductor body. The electrically conductive element comprises an electrically conductive material, and a plurality of inclusions of a phase change material, the phase change material having a phase transition temperature Tc between 150° C. and 400° C., the inclusions being separated from each other and being embedded in the electrically conductive material.

An embodiment relates to a method of manufacturing a power semiconductor device comprising a semiconductor body, active portions in the semiconductor body, and an electrically conductive element. Forming the electrically conductive element comprises forming an electrically conductive material, and forming a plurality of agglomerations of a phase change material, the phase change material having a phase transition temperature between 150° C. and 400° C.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Figure 1A:
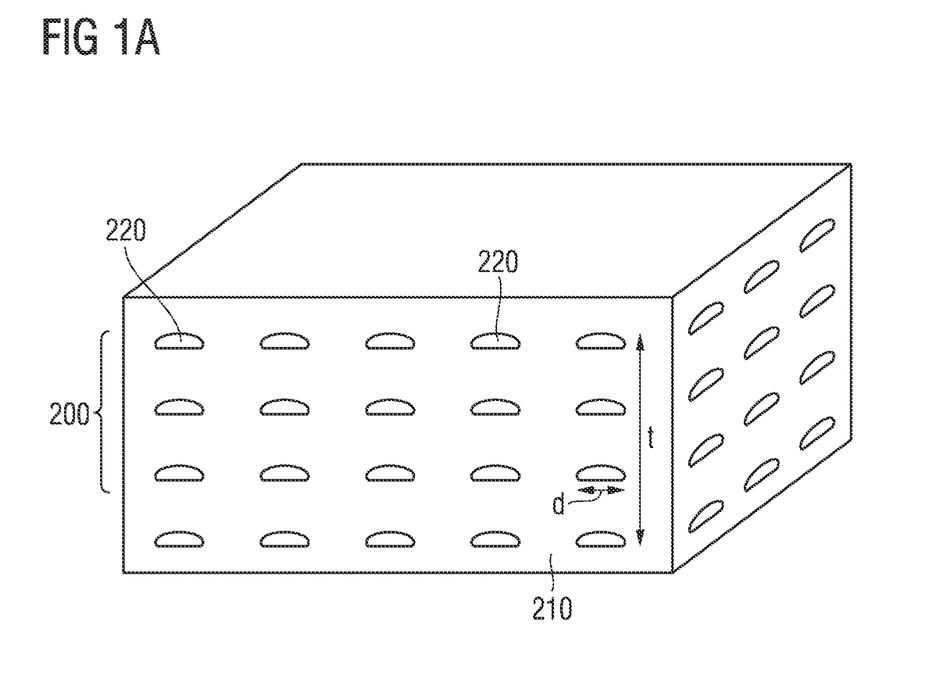
FIG. 1A is a perspective view of a conductive element according to an embodiment.

FIG. 1A is perspective view of a conductive element according to an embodiment. The conductive element 200 shown in FIG. 1A comprises an electrically conductive material 210 and a plurality of inclusions 220 of a phase change material. The phase change material has a phase transition temperature Tc between 150° C. and 400° C. The inclusions 220 are separated from each other and are embedded in the electrically conductive material 210. Accordingly, the conductive element 200 shown in FIG. 1A comprises a matrix of an electrically conductive material.

The electrically conductive material 210 may be metal or any other suitable conductive material. For example, the conductive material 210 may be Al or Cu. The inclusions may be made of a phase change material that has a phase transition temperature Tc between 150° C. and 400° C. For example, the phase change material may be bismuth (Bi) or any other material having a relative low melting point. For example, bismuth has a melting point at 271.3° C. Nevertheless, further materials such as lead, paraffins and special salts may be used. The inclusions of the phase change material may form a three-dimensional array. Alternatively, the inclusions may be disposed in one layer and may form a two-dimensional array. According to an embodiment, the inclusions are irregularly arranged, for example in the form of an irregular pattern. According to an embodiment, the inclusions are regularly arranged, for example in the form of a regular pattern. The inclusions 220 may have an identical shape. Alternatively, the inclusions 220 may have a varying shape and a varying size. This will be explained in more detail below with reference to FIG. 1B.

The electrically conductive element shown in FIG. 1A may absorb heat pulses at a fast rate. For example, the heat pulses may lead to a melting of the phase change material. At a later stage, the absorbed heat may be delivered by the phase change material at a slow rate.

Due to the specific combination of the electrically conductive material with the inclusions of the phase change material, heat may be conducted to the phase change material so as to be absorbed. As a consequence, heat may be absorbed very efficiently compared with a case in which the entire layer consists of a phase change material that may be made of a material having an increasing resistivity when being molten. In contrast, the resistivity of the electrically conductive material may not substantially change when the heat is absorbed by the phase change material disposed within the inclusions.

Bismuth is one example of a suitable phase change material. As mentioned before, bismuth has a melting point at 271.3° C. and shows a melting anomaly. This means that bismuth has an increasing density during transition into the liquid phase. As a consequence, melting of bismuth does not result in a volume increase and hence, a rupture of the surrounding metal matrix may be avoided. Further, bismuth is almost not soluble in aluminum or copper and vice versa. As a consequence, bismuth would not react with the Cu- or Al-matrix material even during melting. Thus, bismuth retains its melting point and its ability to store the excessive heat in many consecutive heating events. Furthermore, the phase transition is reversible even after many pulses. Accordingly, the heat may be temporarily stored in the phase change material and thereafter may be re-transferred to the conductive material. Moreover, bismuth is a non-toxic heavy metal.

Due to the special combination of an electrically conductive material and a plurality of inclusions of a phase change material as shown in FIG. 1, a combination of the beneficial properties of the electrically conductive material, for example a good heat conductance, and further the inclusions of the phase change material, i.e. a heat storage capacity by melting in the relevant temperature range may be achieved.

A thickness t of the electrically conductive element 200 may be approximately 1 to 100 µm, for example 15 to 30 µm. Further, a diameter d of the inclusions may be 0.05 to 10 µm, for example, 0.1 to 2 µm or 0.5 to 1 µm. In this respect, it is to be noted that the term "diameter d of the inclusions" does not necessarily mean that the inclusions have a circular or semi-circular cross-section. The term "diameter d of the inclusions" refers to the largest extension length of the inclusions and the inclusions may have an arbitrary shape.

A mass ratio of bismuth as the phase change material to the electrically conductive element is more than 60 mass-% and less than 95 mass-%. The high mass ratio of the Bi is particularly due to the fact that Bi has a very high density compared to the density of Al or Cu. The heat absorption of the electrically conductive element may be improved by including a large ratio of the phase change material. Nevertheless, when forming such an electrically conductive element, each of the inclusions should be completely surrounded by the electrically conductive material 210 so as to ensure that the heat is efficiently transferred. Accordingly, an optimum ratio of phase change material to the electrical conductive material balances these effects. A volume ratio of the phase change material to the electrically conductive element may be more than 35 vol-% and less than 95 vol-%.

When choosing an appropriate thickness of the electrically conductive element, stress and the effect of wafer bowing have to be taken into account. Moreover, the thickness must be such that the layer may be patterned in an easy manner.

Although bismuth has been described as a phase change material, it is clearly to be understood, that any other material having a phase change temperature between 150° C. and 400° C. may be employed. Further, the phase transition is not restricted to the liquid solid phase change but any other type of phase transition may occur.

Figure 1B:
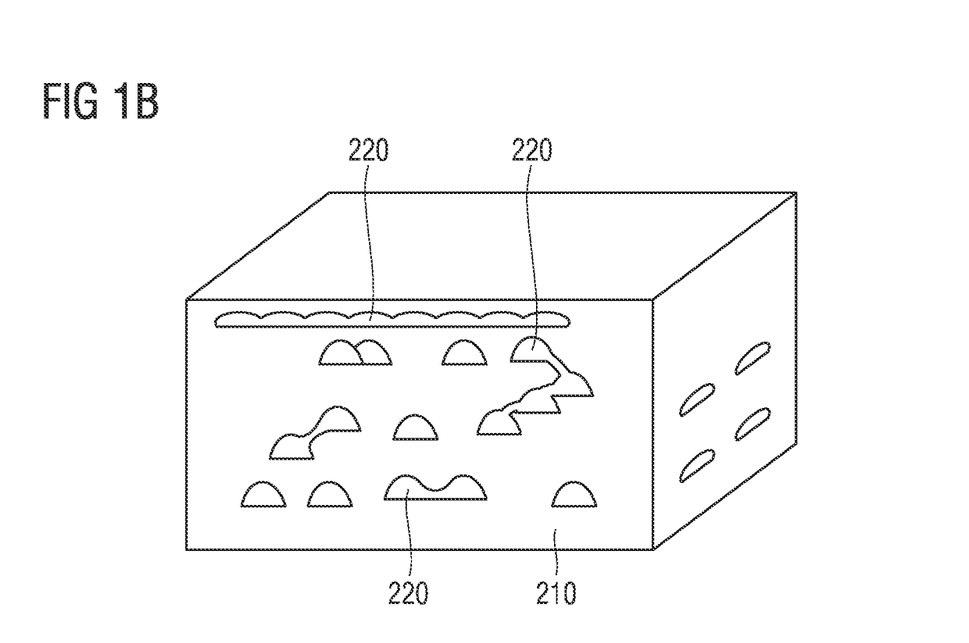
FIG. 1B is a perspective view of a conductive element according to a further embodiment.

FIG. 1B illustrates an embodiment according to which the inclusions 220 have different shapes and sizes. Although the inclusions 220 are illustrated so as to have similar shapes and being partially coalesced, it is clearly to be understood, that the term "different shapes and sizes" also encompasses the case in which the inclusions have completely arbitrary shapes. For example, a single inclusion may be formed by multiple coalesced droplets of the phase change material. The coalesced droplets may form a two-dimensional mesh or structure extending in an arbitrary direction. For example, in addition to the shapes illustrated in FIGS. 1A and 1B, the inclusions or coalesced droplets may form a part of a layer, a vertically or horizontally extending column and others. Nevertheless, the inclusions should be completely surrounded by the electrically conductive material 210 so as to ensure that the heat is efficiently transferred. In case of coalesced droplets of the phase change material the term "diameter d of the inclusions" as defined above refers to the diameter of the single droplets, which may have an arbitrary shape and do not need to be circular or semi-circular.

The electrically conductive element shown in FIGS. 1A and 1B may be suitable as a metallization layer for semiconductor devices such as power devices, in particular power MOSFETs, power IGBTs, power diodes, power-ICs and others. Further, such a conductive element may be applied to diodes, LEDs laser diodes and solar cells. For example, the electrically conductive element may be patterned. Moreover, the electrically conductive element may be used as a heat sink for any kind of applications in which heat is generated.

Figure 2A:
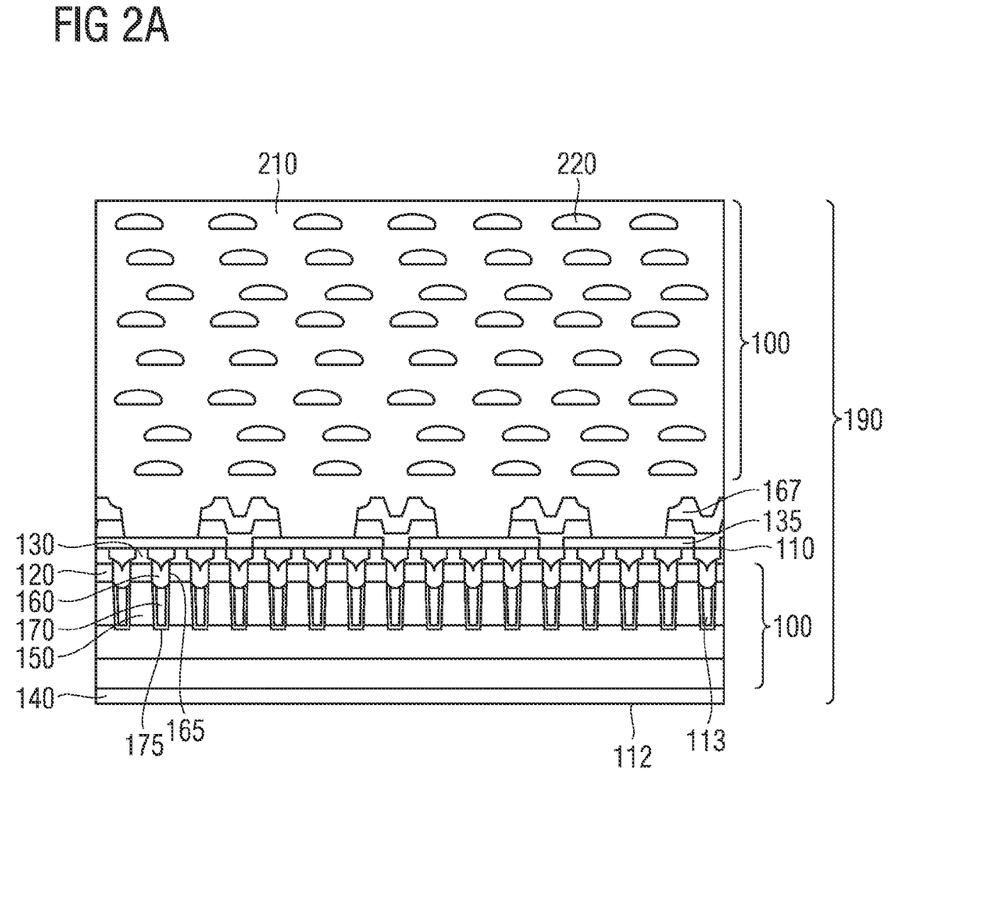
FIG. 2A is a cross-sectional view of a semiconductor device comprising a conductive element according to an embodiment.

FIG. 2A shows an example of a semiconductor device according to an embodiment. Components or active portions of a power MOSFET are disposed within a semiconductor substrate or semiconductor body 100. The illustrated configuration is merely given as an example. As is to be clearly understood, the power semiconductor device may be implemented in any alternative manner. According to the configuration shown in FIG. 2A, a source region 130 is disposed adjacent to a first main surface 110 of the semiconductor substrate 100. A drain region 140 is disposed at a second main surface 112 of the semiconductor substrate 100. Trenches 113 are formed in the first main surface 110 of the semiconductor substrate 100. A field plate 170 is disposed in a lower portion of the trench 113. A gate electrode 160 is disposed in an upper portion of the trench 113. The gate electrode 160 is insulated from an adjacent semiconductor body region 120 by means of a gate dielectric 165. The field plate 170 is insulated from the adjacent drift zone 150 by means of a field plate dielectric 175. The source region 130 is connected to a source contact 135 that is coupled to a source terminal. Further, the gate electrode 160 is coupled to a gate runner 167. The electrically conductive element 200 is disposed over the semiconductor device.

The electrically conductive element 200 may have the configuration shown in FIGS. 1A and 1B. The electrically conductive element 200 may form a wiring structure. For example, the electrically conductive element 200 may be coupled to the source contact 135. According to a further embodiment, the electrically conductive element 200 may be disposed at certain positions at which a large amount of heat may be generated. For example, the electrically conductive element 200 described herein may be used in combination with a conventional electrically conductive element. According to an embodiment, the electrically conductive element may be a component of the semiconductor device. As a result, the electrically conductive element may perform the functionality of this component and further act as a heat sink and dissipate generated heat.

Generally, the electrically conductive element may conduct a current from an active portion in the semiconductor body to a first or second load terminal.

For example, the semiconductor device 190 may be a vertical semiconductor device that may conduct a load current between first and second load terminal contacts along a vertical direction perpendicular to the main surface. As is to be clearly understood, the semiconductor device 190 may also be a horizontal device that conducts a load current between first and second load terminal contacts along a horizontal direction.

The semiconductor device 100 may be a discrete semiconductor device which is a single transistor in the semiconductor body without any other active semiconductor elements interconnected thereto. Although passive components such as resistors, capacitors and inductors may be formed in and/or on the semiconductor body, the discrete semiconductor device is specified to perform an elementary electronic function. Although the discrete semiconductor device 100 may include a large number of transistor cells, the discrete semiconductor device 100 is specified to perform an elementary electronic function and is not divisible into separate components functional in themselves as is typical for integrated circuits.

According to a further embodiment, an integrated circuit may comprise the electrically conductive element as described above. For example, the integrated circuit (IC) may consist of a few to billions of active devices manufactured and interconnected on a single semiconductor body.

Figure 2B:
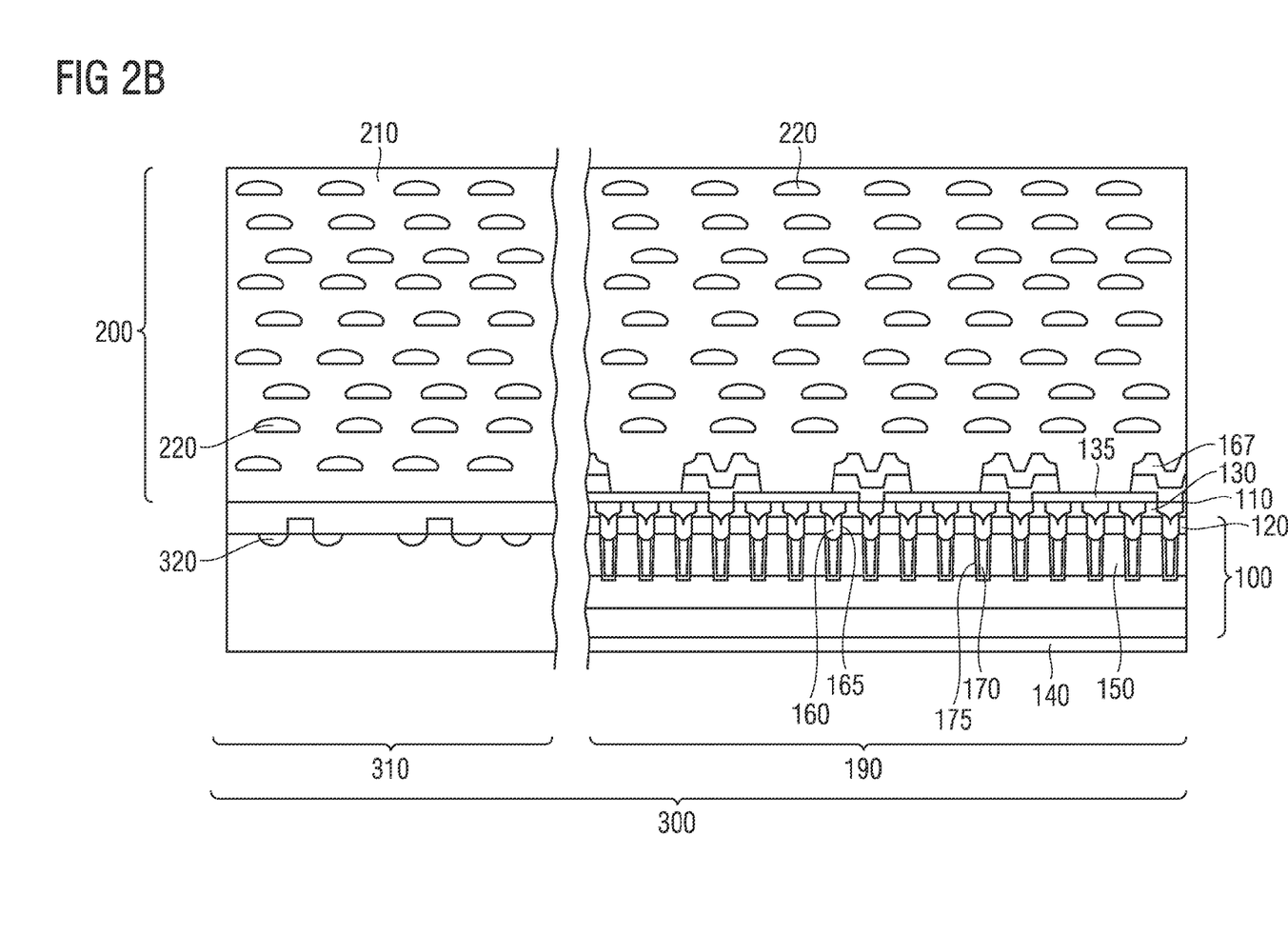
FIG. 2B is a cross-sectional view of an example of an integrated circuit according to an embodiment.

FIG. 2B shows an example of a power-IC 300 according to an embodiment. The power-IC 300 comprises a semiconductor device portion 190 such as shown in FIG. 2A, and circuit elements 320 for implementing another function such as a logic circuit of the power-IC. The electrically conductive element 200 may be formed so as to be disposed over the semiconductor device portion 190 and the circuit elements 320 of the power-IC 300. The circuit elements may comprise active and passive elements, for example, transistors, diodes, resistors, capacitors, inductors. According to a further embodiment, the electrically conductive element 200 may be disposed at certain positions at which a large amount of heat may be generated. For example, the electrically conductive element 200 described herein may be used in combination with a conventional electrically conductive element.

Figure 2C:
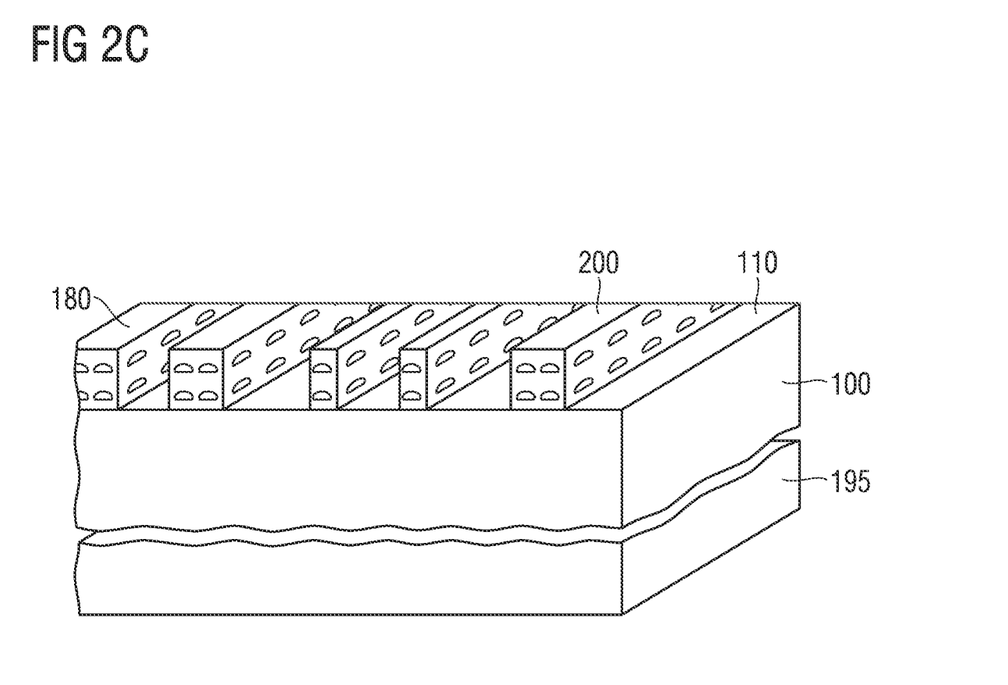
FIG. 2C is a perspective view of a further example of a semiconductor device according to an embodiment.

FIG. 2C shows a further embodiment of a semiconductor device. The semiconductor device 195 of FIG. 2C may be a power device as described above or any other kind of semiconductor device such as a diode, a solar cell, a light emitting device and others. The semiconductor device 195 shown in FIG. 2C further comprises an electrically conductive element 200 that is patterned so as to form lines 180. As is to be clearly understood, the electrically conductive element 200 may be patterned to any other suitable shape, according to the needs of the semiconductor device. For example, the patterned electrically conductive element 200 may form a wiring. According to an embodiment, the electrically conductive element 200 may comprise a plurality of separate conductive sub-elements having a similar or different shape. According to a further embodiment, the electrically conductive element 200 may be combined with a conventional electrically conductive element.

Figure 3A:
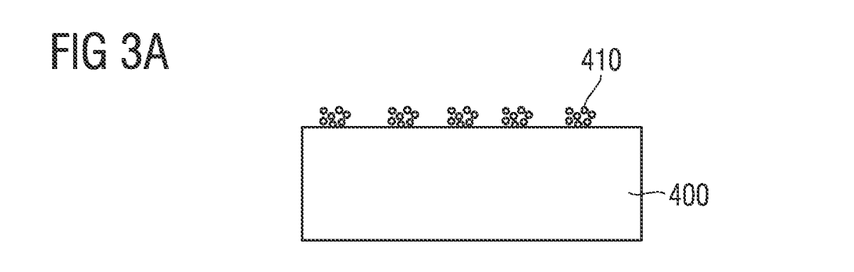
FIGS. 3A to 3H illustrate steps of manufacturing a conductive element according to an embodiment.
Figure 3B:
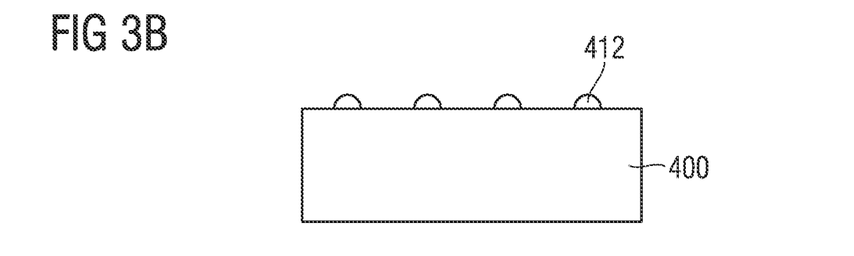

FIGS. 3A to 3H illustrate a method of forming an electrically conductive element according to an embodiment. Bismuth material is sputtered over the whole surface of a base metal element 400. In this context, the term "over the whole surface" is intended to mean that in this stage no mask for patterning the inclusions is employed. According to embodiments, some areas of the base metal element 40 may be masked, but no mask for patterning the inclusions is used. For example, the base metal element 400 may comprise aluminum. According to further embodiments, the base metal element 400 may comprise copper or any other suitable electrically conductive material. As illustrated in FIG. 3A, bismuth is sputtered onto the main surface of the base conductive element 400 at a thickness of 20-1000 nm. In a case in which a continuous layer is not formed over a certain carrier but agglomerations of particles are formed, the term "thickness" relates to the amount of particles that would form a layer over a different carrier, for example on a coatable or wettable carrier, so as to have the specified thickness. For example, the thickness may be 100 to 800 nm. According to this method, the bismuth particles 410 of the thin layer agglomerate to form agglomerations 412. Hence, as is shown in FIG. 3B, the sputtered bismuth material is not formed to a thin layer but to agglomerations 412.

Figure 3C:
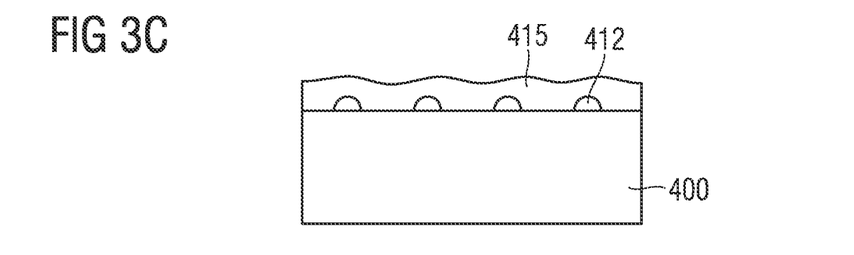

Thereafter, as is illustrated in FIG. 3C, a layer 415 is formed over the structure of FIG. 3B. For example, the layer 415 may comprise the same material as the base conductive element 400. For example, the layer 415 may be formed by sputtering. According to an embodiment, a 2-chamber sputtering device may be used for performing the processes of sputtering the different materials. For example, the layer 415 may be sputtered so as to have a thickness of approximately 0.05 to 1 µm. The conductive layer 415 is sputtered so as to entirely cover the agglomerations or droplets 412 of the bismuth material. Accordingly, its thickness chosen so that the bismuth agglomerations or droplets are covered by the conductive layer 415.

Figure 3D:
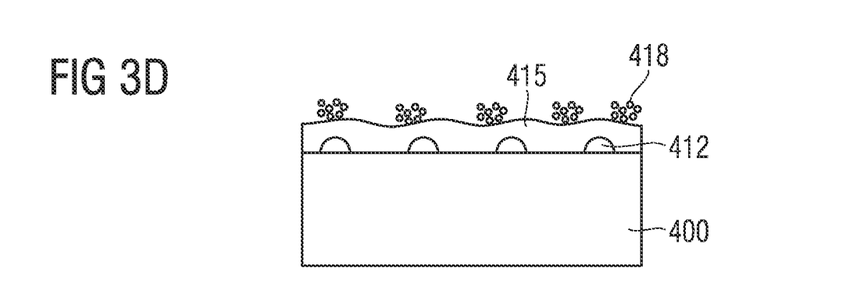
Figure 3E:
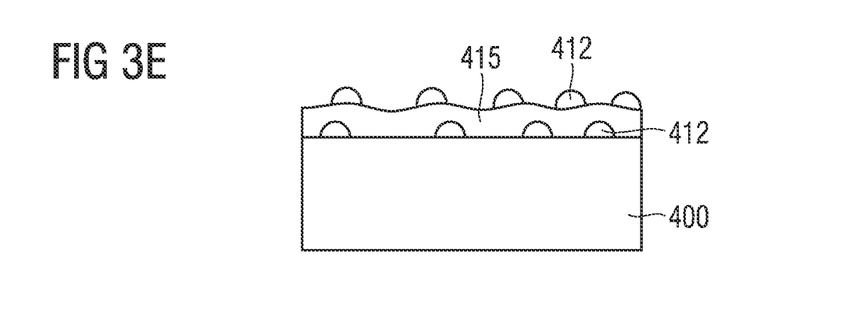
Figure 3F:
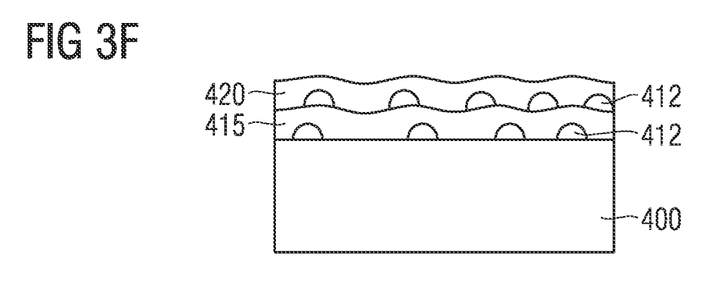

Thereafter, as is shown in FIG. 3D, a further sputtering process is performed so as to form particles 418 of a second layer over the conductive layer 415. For example, again bismuth may be taken as the material for forming the particles 418. The bismuth forms agglomerations or droplets 412 over layer 415 as is shown in FIG. 3E. Thereafter, a second conductive layer 420 is formed over the agglomerations 412 and the first conductive layer 415. For example, Al or Cu may be taken as a metal for the second conductive layer 420. FIG. 3F shows an example of a resulting structure.

Figure 3G:
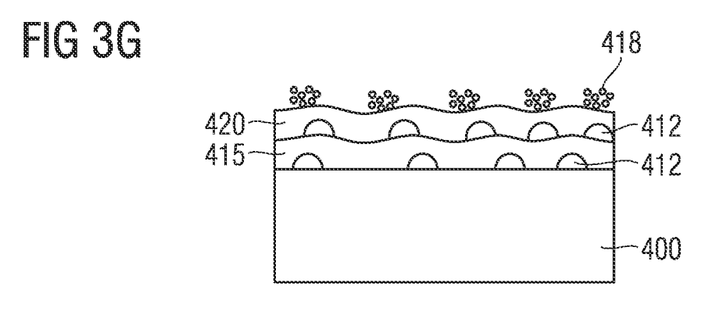
Figure 3H:
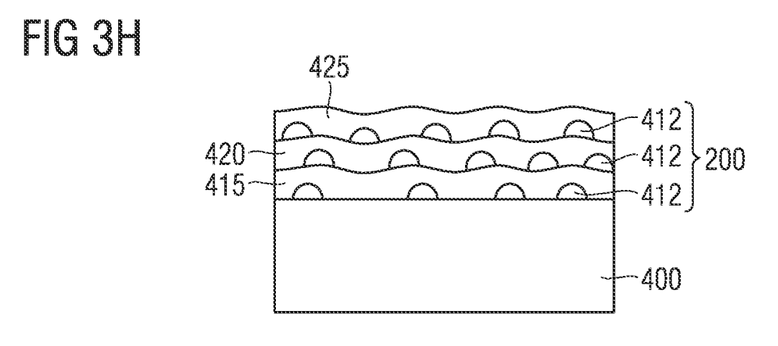

Thereafter, a further thin conductive layer is formed by sputtering so as to form the particles 418 over the second layer 420 as shown in FIG. 3G. The particles 418 form droplets or agglomerations 412. Then a third conductive layer 425 is formed by sputtering over the agglomerations 412. FIG. 3H shows an example of the resulting structure.

The above steps may be repeated a desired number of times until a desired thickness of the conductive element is achieved.

According to further embodiments, also different methods of forming the heat sink may be employed. For example, the phase change material may be formed over the electrically conductive material and thereafter may be patterned so as to form bumps having an arbitrary shape, e.g. rectangular or circular or curved. Thereafter, a further conductive layer may be formed over the bumps, followed by a further method of forming the phase change material. For example, the phase change material may be patterned using a suitable mask, e.g. by a photolithographic method. Depending on the method of manufacturing, the inclusions of the phase change material may be arranged at a regular or an irregular pattern.

Figure 4:
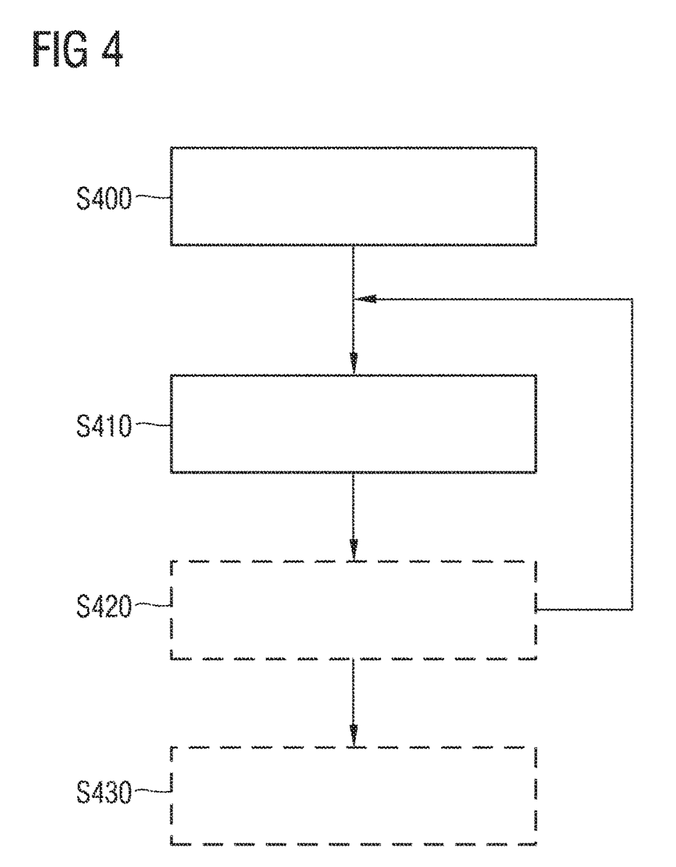
FIG. 4 is a flow diagram illustrating a method of manufacturing a conductive element according to an embodiment.

FIG. 4 summarizes steps of a general method of manufacturing a heat sink according to an embodiment. The method comprises forming (S400) an electrically conductive material and forming (S410) a plurality of agglomerations of a phase change material, the phase change material having a phase transition temperature between 150° C. and 400° C. The method may further comprise forming (S420) an electrically conductive layer over a surface of the electrically conductive material and the agglomerations. Thereafter, the heat sink may be further processed (S430), for example, by patterning the material or by forming further layers, for example, comprising an insulating material over the heat sink.

As has been described above, the present embodiments provide an electrically conductive element that may absorb heat at a high efficiency. Due to the fact that the inclusions of the phase change material are subject to a phase change, the amount of energy per mass unit that can be stored may be largely increased. In more detail, the amount of energy per mass unit that can be stored by a melting process is approximately two orders of magnitude higher than the energy which may be stored by the heat capacity when heating up Cu or Al by one degree. Accordingly, due to the presence of the phase change material, a larger amount of heat may be dissipated. As a result, an overheating of the semiconductor material or the base material may be avoided. As a result, stress induced effects such as interface delamination or cracks may be avoided. Further, the lifetime of the device may be increased. In particular, due to the effective absorption of heat, problems arising when the coefficient of expansion of the semiconductor material is different from the coefficient of expansion of the metallization layer may be avoided.

For example, the electrically conductive element described may be used in a metallization layer, that may be electrically coupled to external components by means of bonding wires. Further, the electrically conductive element may be disposed in a region close to the surface of the semiconductor material or the base material so as to efficiently dissipate heat.

Due to the increased amount of energy that can be absorbed by the described electrically conductive element and the efficiency of the heat transfer process, the thickness of the electrically conductive element may be reduced with respect to a conventional electrically conductive element. As a result, problems during the manufacture of the semiconductor device such as wafer bowing may be avoided. Further, due to the reduced thickness of the electrically conductive element, stress induced effects such as interface delamination or cracks may be avoided. Thus, the lifetime of the device may be increased. According to a further embodiment, an insulating material may be disposed over the conductive element.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A power semiconductor device, comprising:
a semiconductor body;
an active portion of the power semiconductor device formed in the semiconductor body; and
an electrically conductive element electrically coupled to the active portion in the semiconductor body, the electrically conductive element comprising:
an electrically conductive material; and
a plurality of inclusions of a phase change material, the phase change material having a phase transition temperature Tc between 150° C. and 400° C.,
wherein the inclusions are separated from each other and embedded in the electrically conductive material.

2. The power semiconductor device of claim 1, wherein the phase change material is solid at a temperature below Tc and is liquid at a temperature above Tc.

3. The power semiconductor device of claim 1, wherein the phase change material is at least one selected from the group consisting of tin, bismuth, zinc and indium.

4. The power semiconductor device of claim 1, wherein the electrically conductive material is a metal.

5. The power semiconductor device of claim 4, wherein the metal is aluminum or copper.

6. The power semiconductor device of claim 1, wherein the inclusions have a diameter of 0.1 to 10 μm.

7. The power semiconductor device of claim 1, wherein a mass ratio of the phase change material to the electrically conductive element is more than 30 mass-% and less than 95 mass-%.

8. The power semiconductor device of claim 1, wherein a volume ratio of the phase change material to the electrically conductive element is more than 35 volume-% and less than 95 volume-%.

9. The power semiconductor device of claim 1, wherein the electrically conductive element has a thickness between 1 μm and 100 μm.

10. The power semiconductor device of claim 1, wherein the electrically conductive element is patterned so as to form lines.

11. The power semiconductor device of claim 1, wherein the electrically conductive element is disposed at least at one side of the semiconductor body and patterned so as to form a wiring structure.

12. The power semiconductor device of claim 1, wherein the electrically conductive element is configured to conduct a current from the active portion in the semiconductor body to a first or to a second load terminal.

13. The power semiconductor device of claim 1, wherein:
the semiconductor device is a vertical semiconductor device comprising a first load terminal contact at a first side of the semiconductor body and a second load terminal contact at a second side of the semiconductor body opposite the first side;
the semiconductor device is configured to conduct a load current between the first and the second load terminal contacts along a vertical direction perpendicular to the main surface;
the electrically conductive element is configured to conduct a current from the active portion in the semiconductor body to the first or to the second load terminal.

14. The power semiconductor device of claim 1, further comprising a transistor cell array, the electrically conductive element being electrically coupled to at least one of the group consisting of a source terminal of the transistor cell array, a drain terminal of the transistor cell array, and a gate terminal of the transistor cell array.

* * * * *